United States Patent
Choi

(10) Patent No.: US 6,869,871 B1
(45) Date of Patent: Mar. 22, 2005

(54) METHOD OF FORMING METAL LINE IN SEMICONDUCTOR DEVICE INCLUDING FORMING FIRST AND SECOND ZIRCONIUM FILMS

(75) Inventor: Kyeong Keun Choi, Suwon-si (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/744,494

(22) Filed: Dec. 23, 2003

(30) Foreign Application Priority Data

Nov. 13, 2003 (KR) .................. 10-2003-0080034

(51) Int. Cl.[7] ...................... H01L 21/4763; H01L 21/44
(52) U.S. Cl. ...................... 438/622; 438/628; 438/638; 438/648; 438/656; 438/675
(58) Field of Search ................ 438/622, 628, 438/629, 638, 648, 654, 656, 675, 720; 257/729

(56) References Cited

U.S. PATENT DOCUMENTS 6,184,121 B1 * 2/2001 Buchwalter et al. ........ 438/622
6,303,498 B1 * 10/2001 Chen et al. .................. 438/675
6,649,522 B2 * 11/2003 Farrar ......................... 438/687

* cited by examiner

Primary Examiner—Olik Chaudhuri
Assistant Examiner—William M. Brewster
(74) Attorney, Agent, or Firm—Marshall Gerstein & Borun LLP

(57) ABSTRACT

Provided is a method of forming a metal line in a semiconductor device. According to the present invention, a barrier metal layer, a Zr film, and a Cu thin film is sequentially formed in insides of a dual damascene pattern comprising via holes and trenches. Then, a Zr film is formed on the Cu thin film, and Zr is allowed to be diffused into crystal particles of Cu and interfaces between the crystal particles by carrying out a heat treatment process thereto, so that uniform Cu (Zr) bonds are formed regardless of a depth. As a result, an EM resistance characteristic of the Cu thin film even in narrower and deeper via holes can be improved, and thus reliability of process and an electrical characteristic of a device can be also improved.

21 Claims, 4 Drawing Sheets

METHOD OF FORMING METAL LINE IN SEMICONDUCTOR DEVICE INCLUDING FORMING FIRST AND SECOND ZIRCONIUM FILMS

BACKGROUND

1. Field of the Invention

The present invention relates to a method of forming a metal line in a semiconductor device and, more particularly, to a method of forming a metal line in a semiconductor device capable of improving an electro migration (EM) characteristic of the metal line.

2. Discussion of Related Art

With increase in the degree of integration of a semiconductor device, in order to reduce resistance of a metal line, it has been tried to form the metal line out of metal material having a lower resistivity. Recently, it was tried to form the metal line out of copper, but there was a problem that the copper has a lower resistivity but a poor EM characteristic.

It is tried to inject Zr into a metal line by using a physical vapor deposition method so as to improve the EM characteristic of the metal line. Zr is an element having little solubility into metal materials (in particular, Cu) and is known to be capable of improving the EM characteristic of a metal thin film (in particular, a Cu thin film). On the other hand, although addition of Zr may increase the resistance of the metal thin film, it is known that a small amount of addition of Zr does not increase largely the resistivity of the metal thin film.

However, with increase in the degree of integration of a device, since Zr is not injected into via hole portions of a narrower and deeper dual damascene pattern in the course of injecting Zr using a PVD method, it is difficult to improve the EM characteristic in via plug portions.

SUMMARY OF THE INVENTION

The present invention is directed to a method of forming a metal line in a semiconductor device, in which an EM characteristic of a Cu thin film even in narrower and deeper via holes can be improved and thus reliability of process and an electrical characteristic of a device can be also improved, by sequentially forming a barrier metal layer, a Zr film, and a Cu thin film in insides of a dual damascene pattern comprising via holes and trenches, forming a Zr film on the Cu thin film, and then allowing Zr to be diffused into crystal particles of Cu and interfaces between the crystal particles by carrying out a heat treatment process to form a uniform Cu (Zr) bonding regardless of a depth.

One aspect of an embodiment of the present invention is to provide a method of forming a metal line in a semiconductor device, comprising steps of: forming an interlayer insulating film on a semiconductor substrate in which various elements for forming a semiconductor device are formed; forming a dual damascene pattern in the interlayer insulating film; forming a barrier metal layer over the entire structure including the dual damascene pattern; forming a first Zr film on the barrier metal layer; filling up the dual damascene pattern with a conductive layer; forming a second Zr film over the entire structure including the conductive layer; forming a Zr compound metal layer by allowing the conductive layer to react with Zr component of the first and second Zr films by use of a heat treatment process; and removing the Zr compound metal layer and the barrier metal layer on the interlayer insulating film to form the metal line.

Here, the barrier metal layer may be formed to have a laminated structure of TaN/Ta. At that time, the TaN film is formed to have a thickness of 50 to 150 Å, and the Ta film is formed to have a thickness of 100 to 300 Å.

The first Zr film or the second Zr film may be formed using a CVD method or a PECVD method. When the first Zr film or the second Zr film is formed, $Zr(N(C_2H_5)_2)_4$ or $Zr(N(CH_3)_2)_4$ is supplied as a precursor, inert gas such as Ar or He is supplied as a carrier gas, and $H_2$ gas is supplied as a reaction gas. At that time, a supply amount of the precursor is set to be within a range of 30 to 1000 sccm, and a supply amount of the reaction gas is set to be within a range of 100 to 3000 sccm. Then, the first Zr film or the second Zr film is formed at a temperature of 300 to 400° C., with a power of 200 to 5000 W applied. The first Zr film may be formed to have a thickness of 50 to 1000 Å. On the other hand, the second Zr film may be formed using a physical vapor deposition method or CVD method.

The conductive layer may be formed by forming a metal seed layer and then carrying out an electroplating method using the metal seed layer, and the conductive layer or the seed layer may be formed out of copper.

The heat treatment process may be carried out in an $N_2/H_2$ atmosphere by using an annealing method such as an RTP or a furnace annealing method, a mixture ratio of the $N_2$ and $H_2$ may be set to be within a range of 5:1 to 15:1, and the heat treatment process may be carried out at a temperature of 100 to 300° C. for 1 to 40 minutes.

After forming the metal line, a capping layer may be formed over the entire structure including the metal line, and the capping layer may be formed out of SiN. At that time, the SiN may be formed at a temperature of 200 to 400° C. by using $SiH_4$ gas, $N_2$ gas, and $NH_3$ gas to have a thickness of 100 to 500 Å.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Hereinafter, the preferred embodiment of the present invention will be described with reference to the accompanying drawings. However, the present invention is not limited to embodiments described below, and can be embodied in various aspects. Further, the present embodiments are provided to fully disclose the invention and to inform those who skilled in the art of the scope of the invention, and the scope of the present invention should be understood by the claims of the present invention.

On the other hand, when it is described that one film is placed 'on' another film or a semiconductor substrate, which means that the one film may be directly contacted to the another film or the semiconductor substrate, or be placed on a third film thereon. Furthermore, the thickness and the size of each layer of drawings are exaggerated for convenient and clear explanation. The same numeral denotes the same element.

FIGS. 1A to 1H are cross-sectional views for explaining a method of forming a metal line in a semiconductor device according to embodiments of the present invention.

Figure 1A:
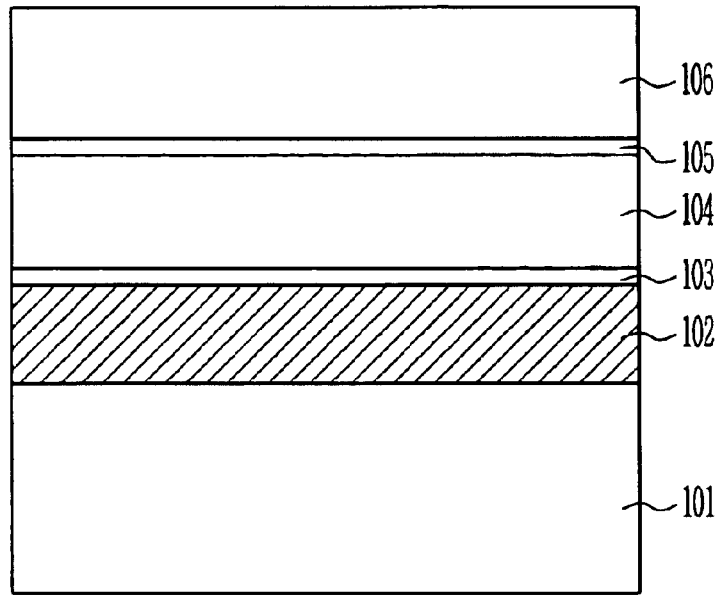
FIGS. 1A to 1H are cross-sectional views illustrating a method of forming a metal line in a semiconductor device according to an embodiment of the present invention.

Referring to FIG. 1A, a semiconductor substrate 101, in which various elements (not shown) such as a transistor, a capacitor, a memory cell, etc. constituting a semiconductor device are formed, is prepared. At that time, a bit line or a lower metal line 102 may be formed in the uppermost layer of the semiconductor substrate 101 as one of various elements for instituting the semiconductor device.

Subsequently, a first capping layer 103, a first interlayer insulating film 104, an etch-stopping layer 105, and a second interlayer insulating film 106 are sequentially formed over the semiconductor substrate 101 including the lower metal line 102.

Hereto, the first capping layer 103 may be formed out of a SiN film, and is formed to prevent metal component of the lower metal line 102 from diffusing into the first interlayer insulating film 104. In case where the first capping layer 103 is formed of the SiN film, the SiN film may be formed using $SiH_4$ gas, $N_2$ gas, and $NH_3$ gas at the temperature of 200 to 400° C. to have the thickness of 100 to 500 Å.

The first interlayer insulating film 104 and the second interlayer insulating film 106 may be formed out of fluorine-doped silicate glass (FSG) or SiOC film. At that time, because the height of via plugs is decided depending on the thickness of the first interlayer insulating film 104, it is desirable that the thickness of the first interlayer insulating film 104 be adjusted in consideration of the height of the via plugs which are to be formed in subsequent processes. Then, it is desirable that the thickness of the second interlayer insulating film 106 be adjusted in consideration of the height of an upper metal line, which is to be formed in subsequent processes. Further, the second interlayer insulating film 106 may be formed to have the same thickness as the upper metal line.

On the other hand, the etch-stopping layer 105 is formed to prevent the first interlayer insulating film 104 from being etched when the second interlayer insulating film 106 is etched in a subsequent etch process, and may be formed out of SiN film.

Figure 1B:
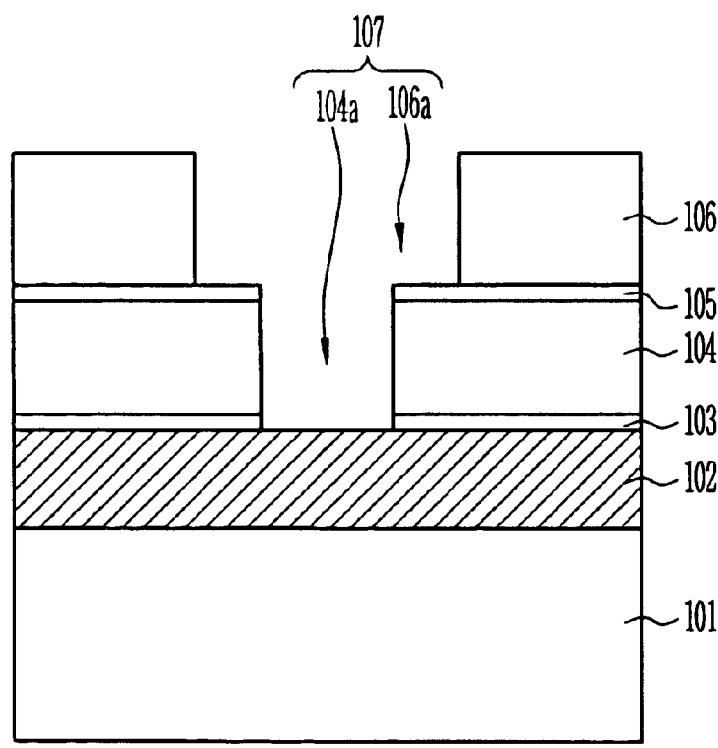

Referring FIG. 1B, via hole 104a is formed in the first interlayer insulating film 104 by using an etch process, a trench 106a is formed in the second interlayer insulating film 106, and thus a dual damascene pattern 107 consisting of the via hole 104a and the trench 106a is formed. The dual damascene pattern 107 is formed so that a portion of the lower metal line 102 is opened the via hole 104a and the trench 106a.

Herein, the dual damascene pattern 107 can be formed using a method that the via hole 104a is previously formed and then the trench 106a is formed, or a method that the trench 106a is previously formed and then the via hole 104a is formed. For example, a case, where the dual damascene pattern 107 is formed using the method that the via hole 104a is previously formed, will be described below. First, the second interlayer insulating film 106, the etch-stopping layer 105, the first interlayer insulating film 104, and the first capping layer 103 corresponding to a portion, in which a via hole is to be formed in the etch process, are etched in sequence to form the via hole 104a. Subsequently, the second interlayer insulating film 106 corresponding to a portion, in which a trench is to be formed in a subsequent process, is etched to from the trench 106a. At that time, because the first interlayer insulating film 104 is not etched due to the etch-stopping layer 105, the via hole 104a of the first interlayer insulating film 104 maintains its shape. As a result, the dual damascene pattern 107 consisting the via hole 104a and the trench 106a is formed.

Figure 1C:
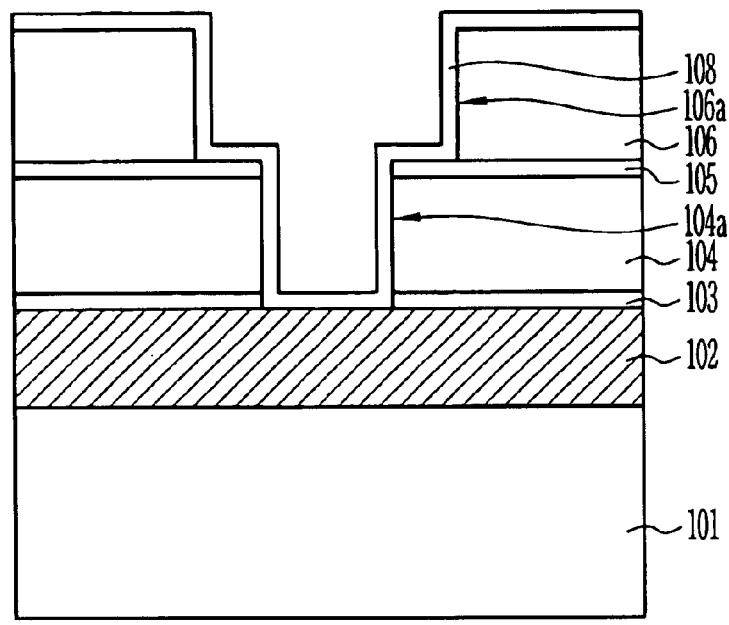

Referring to FIG. 1C, a barrier metal layer 108 is formed over the entire structure including the dual damascene pattern 107. The barrier metal layer 108 may be formed in a stacked configuration of TaN/Ta. In this case, the TaN film may be formed to have a thickness of 50 to 150 Å, and the Ta film is formed to have a thickness of 100 to 300 Å.

Figure 1D:
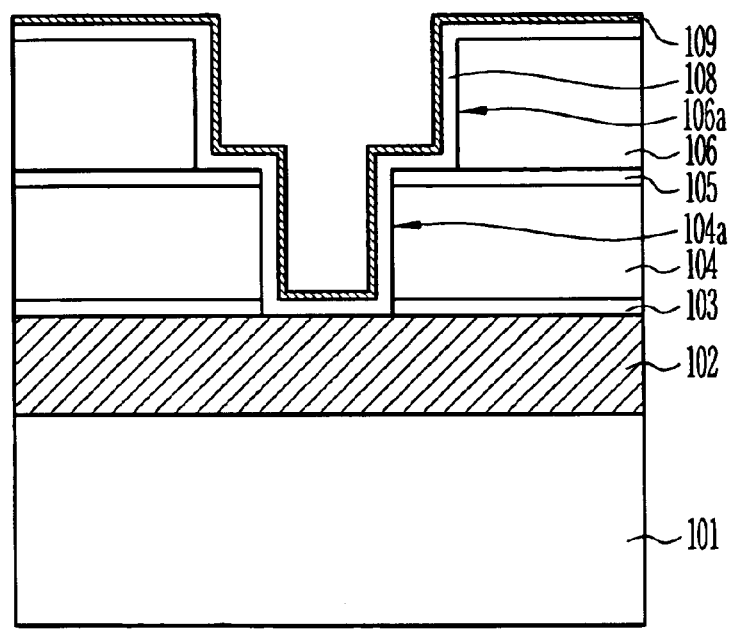

Referring to FIG. 1D, a first Zr film 109 is formed on the barrier metal layer 108. The first Zr film 109 may be formed by a chemical vapor deposition (CVD) method or plasma enhanced chemical vapor deposition (PECVD) method. In this case, the first Zr film 109 may be formed in $H_2$ reduction reaction described in the following chemical equations 1 or 2 by supplying Zr $(N(C_2H_5)_2)_4$ or Zr $(N(CH_3)_2)_4$ as precursor, an inert gas such as Ar or He as a carrier gas, and $H_2$ gas as a reaction gas.

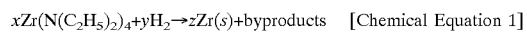
$xZr(N(C_2H_5)_2)_4 + yH_2 \rightarrow zZr(s) + $ byproducts    [Chemical Equation 1]

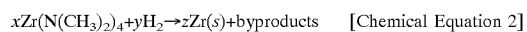
$xZr(N(CH_3)_2)_4 + yH_2 \rightarrow zZr(s) + $ byproducts    [Chemical Equation 2]

At that time, a supply amount of the precursor may be set to be within a range of 30 to 1000 sccm, and a supply amount of the reaction gas may be set to be within a range of 100 to 3000 sccm, and the first Zr film may be formed at a temperature of 300 to 400° C. and with applied power of 200 to 5000 W and be formed to have the thickness of 50 to 1000 Å.

As described above, the first Zr film 109 is formed using the PECVD method, so that the first Zr film 109 can be formed on the side wall and the bottom surface of the narrower and deeper via hole 104a.

Figure 1E:
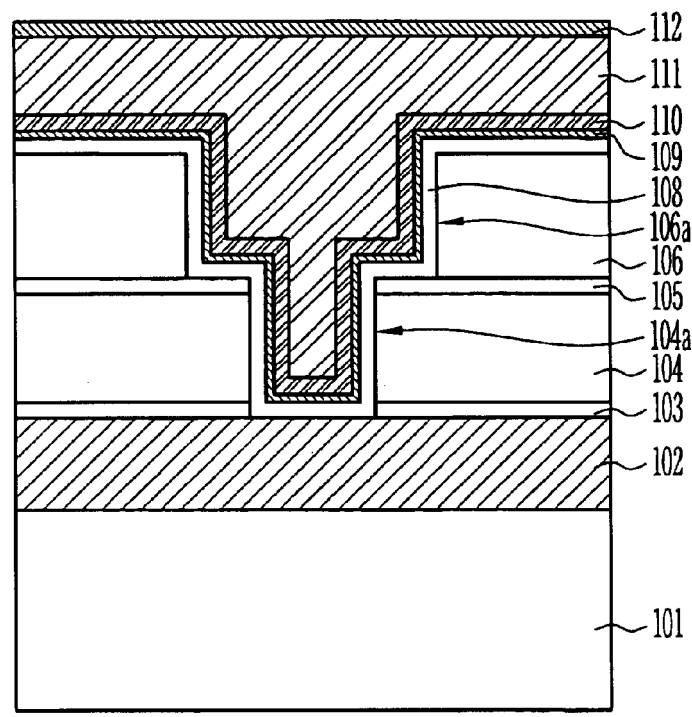

Referring to FIG. 1E, a metal seed layer 110 is formed on the first Zr film 109. At that time, it is desirable that the metal seed layer 110 be formed out of copper and formed to have the thickness of 500 to 2000 Å. Next, a metal layer 111 is formed over the entire structure so as to completely fill up the dual damascene pattern 107. Preferably, the metal layer 111 may be formed of copper, and formed to have the thickness of 6000 to 10000 Å using an electrical plating method. Then, a second Zr film 112 is formed on the metal layer 111. The second Zr film 112 may be formed using a physical vapor deposition method, or be formed using the same method as the first Zr film 109.

Figure 1F:
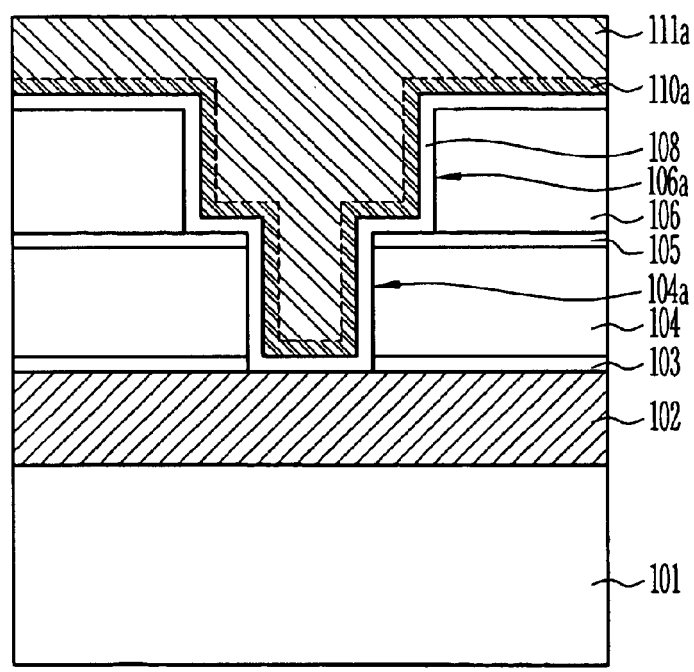

Referring to FIG. 1F, a Zr compound metal layers (110a and 111a) are formed using a heat treatment process. When the heat treatment process is carried out, Zr component of the first Zr film (109 of FIG. 1E) diffuses into the metal seed layer (110 of FIG. 1E) and acts on metal component, and at the same time, Zr component of the second Zr film (112 of FIG. 1E) diffuses into the metal layer (111 of FIG. 1E) and acts on metal component of the metal layer (111 of FIG. 1E), and thus Zr compound metal layers 110a and 111a come to be formed. More specifically, in case the metal seed layer (110 of FIG. 1E) and the metal layer (111 of FIG. 1E) are formed out of Cu, Zr is allowed to be diffused into crystal particles of the Cu and interfaces between the crystal particles by using a heat treatment process to form a Cu (Zr) bonding. At that time, because Zr of the first Zr film (109 of FIG. 1E) is diffused into the upper part and at the same time, Zr of the second Zr film (112 of FIG. 1E) is diffused into the lower part, a uniform Cu (Zr) bonding is formed in the narrower and deeper via hole 104a regardless of a depth thereof.

Such heat treatment process may be carried out under a $N_2/H_2$ atmosphere at the temperature of 100 to 300° C. for 1 to 40 minutes in an annealing method. At that time, the mixture ratio of the $N_2$ and $H_2$ may be set to be within a range of 5:1 to 15:1.

Figure 1G:
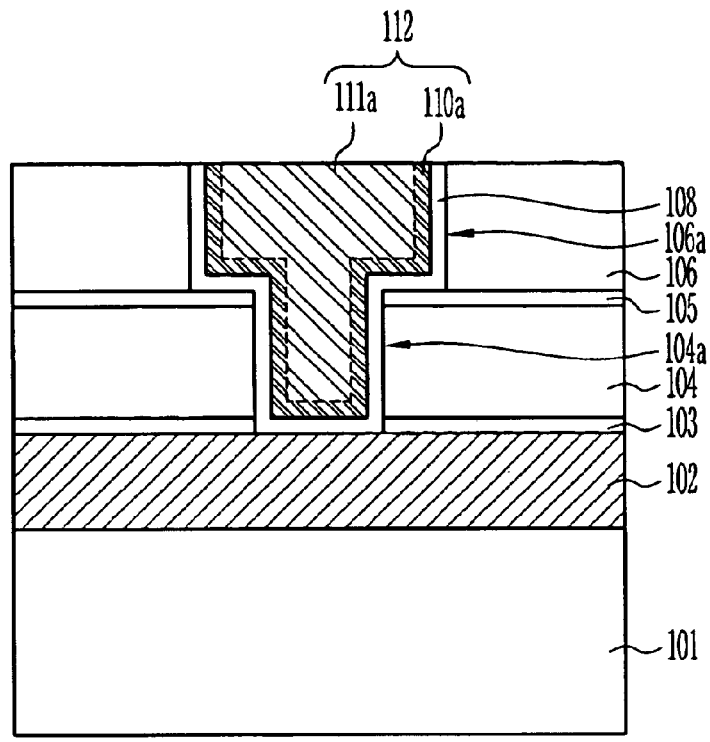

Referring to FIG. 1G, the Zr compound metal layers 111a and 110a and the barrier metal layer 108 on the second interlayer insulating film 106 are removed and remains only in the dual damascene patterns 106a and 104a, so that a metal line 113 having a predetermined shape can be formed. At that time, the Zr compound metal layers 111a and 110a and the barrier metal layer 108 on the second interlayer insulating film 106 can be removed by using the CMP process.

Figure 1H:
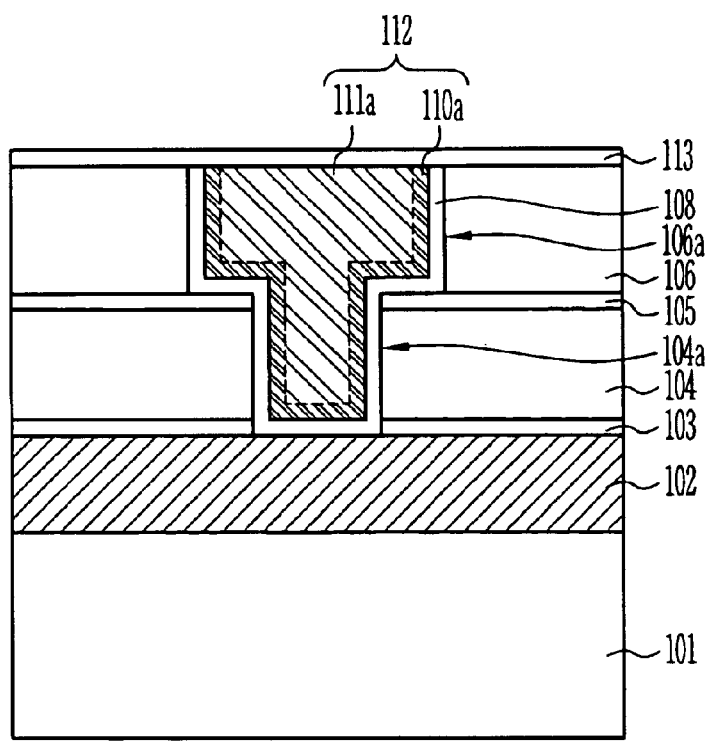

Referring to FIG. 1H, a second capping layer 114 is formed over the entire structure including the metal layer 113. The second capping layer 114 is formed for the same purpose as the first capping layer 103, and may be formed using the same method as the first capping layer 103.

As described above, the EM characteristic of the Cu thin film even in the narrower and deeper via holes can be improved and thus reliability of process and an electrical characteristic of a device can be also improved, by sequentially forming a barrier metal layer, a Zr film, and a Cu thin film in insides of a dual damascene pattern comprising via holes and trenches, forming a Zr film on the Cu thin film, and then allowing Zr to be diffused into crystal particles of Cu and interfaces between the crystal particles by carrying out a heat treatment process to form a uniform Cu (Zr) bonding regardless of depths.

Although the foregoing description has been made with reference to the preferred embodiments, it is to be understood by the ordinary skilled in the art that changes and modifications of the present invention may be made without departing from the spirit and scope of the present invention and appended claims.

What is claimed is:

1. A method of forming a metal line in a semiconductor device, comprising the steps of:
    forming an interlayer insulating film on a semiconductor substrate in which various elements for forming a semiconductor device are formed;
    forming a dual damascene pattern in the interlayer insulating film;
    forming an barrier metal layer over the entire structure including the dual damascene pattern;
    forming a first Zr film on the barrier metal layer;
    filling the dual damascene pattern with a conductive layer;
    forming a second Zr film over the entire structure including the conductive layer;
    forming a Zr compound metal layer by allowing the conductive layer to react with Zr components of the first and the second Zr films by means of a heat treatment process; and
    removing the Zr compound metal layer and the barrier metal layer on the interlayer insulating film to form a metal line.

2. The method of forming a metal line in a semiconductor device according to claim 1, wherein the barrier metal layer is formed to have a laminated structure of TaN/Ta.

3. The method of forming a metal line in a semiconductor device according to claim 2, wherein the TaN film is formed to have a thickness of 50 Å to 150 Å, and the Ta film is formed to have a thickness of 100 Å to 300 Å.

4. The method of forming a metal line in a semiconductor device according to claim 1, wherein the first Zr film or the second Zr film is formed using a CVD method or a PECVD method.

5. The method of forming a metal line in a semiconductor device according to claim 4, wherein, when the first Zr film and the second Zr film are formed, Zr $(N(C_2H_5)_2)_4$ or Zr $(N(CH_3)_2)_4$ is supplied as precursor, an inert gas such as Ar or He is supplied as a carrier gas, and $H_2$ gas is supplied as a reaction gas.

6. The method of forming a metal line in a semiconductor device according to claim 5, wherein a supply amount of the precursor is set to be in the range of 30 sccm to 1000 sccm, and a supply amount of the reaction gas is set to be in the range of 100 sccm to 3000 sccm.

7. The method of forming a metal line in a semiconductor device according to claim 6, wherein the first Zr film or the second Zr film is formed at a temperature in the range of 300° C. to 400° C., with a power of 200 W to 5000 W applied.

8. The method of forming a metal line in a semiconductor device according to claim 5, wherein the first Zr film or the second Zr film is formed at a temperature in the range of 300° C. to 400° C., with a power of 200 W to 5000 W applied.

9. The method of forming a metal line in a semiconductor device according to claim 4, wherein the first Zr film or the second Zr film is formed at a temperature in the range of 300° C. to 400° C., with a power of 200 W to 5000 W applied.

10. The method of forming a metal line in a semiconductor device according to claim 1, wherein the first Zr film is formed to have a thickness in the range of 50 Å to 1000 Å.

11. The method of forming a metal line in a semiconductor device according to claim 1, wherein the conductive layer is formed by forming a metal seed layer and then performing an electroplating method using the metal seed layer.

12. The method of forming a metal line in a semiconductor device according to claim 1, wherein the conductive layer is formed of copper.

13. The method of forming a metal line in a semiconductor device according to claim 1, wherein the conductive layer is formed of copper.

14. The method of forming a metal line in a semiconductor device according to claim 1, wherein the second Zr film is formed using a physical vapor deposition method or chemical vapor deposition method.

15. The method of forming a metal line in a semiconductor device according to claim 1, wherein the heat treatment process is carried out in an $N_2/H_2$ atmosphere by using an annealing method such as a furnace annealing or an RTP.

16. The method of forming a metal line in a semiconductor device according to claim 15, wherein a mixture ratio of the $N_2$ and $H_2$ is in the range of 5:1 to 15:1.

17. The method of forming a metal line in a semiconductor device according to claim 15, wherein the heat treatment process is carried out at a temperature in the range of 100° C. to 300° C. for 1 to 40 minutes.

18. The method of forming a metal line in a semiconductor device according to claim 1, wherein the heat treatment process is carried out at a temperature in the range of 100° C. to 300° C. for 1 to 40 minutes.

19. The method of forming a metal line in a semiconductor device according to claim 1, further comprising a step of forming a capping layer over the entire structure including the metal line, after forming the metal line.

20. The method of forming a metal line in a semiconductor device according to claim 19, wherein the capping layer is formed of SiN.

21. The method of forming a metal line in a semiconductor device according to claim 20, wherein the SiN is formed at a temperature of 200° C. to 400° C. by using $SiH_4$ gas, $N_2$ gas, and $NH_3$ gas to have a thickness of 100 Å to 500 Å.

* * * * *

UNITED STATES PATENT AND TRADEMARK OFFICE
CERTIFICATE OF CORRECTION

PATENT NO. : 6,869,871 B1
DATED : March 22, 2005
INVENTOR(S) : Kyeong K. Choi

It is certified that error appears in the above-identified patent and that said Letters Patent is hereby corrected as shown below:

Title page,
Item [75], Inventors, after "Kyeong Keun Choi," please delete "Suwon-si" and insert -- Gyeonggi-do -- in its place.
Item [73], Assignee, after "Hynix Semiconductor Inc.," please delete "Ichon-Shi" and insert -- Kyungki-Do -- in its place.
Item [74], *Attorney, Agent, or Firm*, please delete "Marshall Gerstein & Borun LLP" and insert -- Marshall, Gerstein & Borun LLP -- in its place.

Column 5,
Line 39, after "Forming" please delete "an" and insert -- a -- in its place.

Column 6,
Line 32, after "according to" please delete "claim 1" and insert -- claim 11 -- in its place.

Signed and Sealed this

Twenty-third Day of August, 2005

JON W. DUDAS
*Director of the United States Patent and Trademark Office*